US012676588B2

(12) United States Patent
Iwamoto

(10) Patent No.: US 12,676,588 B2
(45) Date of Patent: Jul. 7, 2026

(54) COMPOSITE SUBSTRATE AND ACOUSTIC WAVE DEVICE

(71) Applicant: Murata Manufacturing Co., Ltd., Nagaokakyo (JP)

(72) Inventor: Hideki Iwamoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 945 days.

(21) Appl. No.: 17/960,856

(22) Filed: Oct. 6, 2022

(65) Prior Publication Data

US 2023/0051116 A1       Feb. 16, 2023

Related U.S. Application Data

(63) Continuation of application No. PCT/JP2021/015313, filed on Apr. 13, 2021.

(30) Foreign Application Priority Data

Apr. 20, 2020     (JP) ................................. 2020-074569

(51) Int. Cl.
*H03H 9/02* (2006.01)
*H03H 9/145* (2006.01)
*H03H 9/25* (2006.01)

(52) U.S. Cl.
CPC .... *H03H 9/02574* (2013.01); *H03H 9/02559* (2013.01); *H03H 9/145* (2013.01); *H03H 9/25* (2013.01)

(58) Field of Classification Search
CPC ........... H03H 9/02574; H03H 9/02559; H03H 9/145; H03H 9/25
See application file for complete search history.

(56) References Cited

U.S. PATENT DOCUMENTS

| 2012/0241877 A1 | 9/2012 | Abe et al. | |
| 2018/0320308 A1 | 11/2018 | de Oliveira et al. | |
| 2019/0393858 A1 | 12/2019 | Iwamoto et al. | |
| 2020/0028486 A1* | 1/2020 | Kishino | .................. H03H 9/25 |
| 2020/0144981 A1 | 5/2020 | Knapp et al. | |
| 2020/0287513 A1* | 9/2020 | Yamamoto | ............... H03H 9/25 |

FOREIGN PATENT DOCUMENTS

| JP | 2012204870 A | 10/2012 |
| WO | 2017109131 A1 | 6/2017 |
| WO | 2017209131 A1 | 12/2017 |
| WO | 2018163842 A1 | 9/2018 |
| WO | 2018215152 A1 | 11/2018 |

OTHER PUBLICATIONS

International Search Report in PCT/JP2021/015313, mailed Jun. 22, 2021, 4 pages.
Written Opinion in PCT/JP2021/015313, mailed Jun. 22, 2021, 5 pages.

* cited by examiner

*Primary Examiner* — J. San Martin
(74) *Attorney, Agent, or Firm* — Keating & Bennett, LLP

(57) ABSTRACT

A composite substrate includes a support substrate made of Si, a high acoustic velocity material layer, a low acoustic velocity film, and a piezoelectric layer. In Euler angles ($\varphi$, $\theta$, $\psi$) of the Si, $\varphi$ and $\theta$ are within regions indicated by hatching with slant lines in FIG. 4. An acoustic wave device includes an IDT electrode in contact with the piezoelectric layer of the composite substrate.

18 Claims, 3 Drawing Sheets

COMPOSITE SUBSTRATE AND ACOUSTIC WAVE DEVICE

CROSS REFERENCE TO RELATED APPLICATIONS

This application claims the benefit of priority to Japanese Patent Application No. 2020-074569 filed on Apr. 20, 2020 and is a Continuation Application of PCT Application No. PCT/JP2021/015313 filed on Apr. 13, 2021. The entire contents of each application are hereby incorporated herein by reference.

BACKGROUND OF THE INVENTION

1. Field of the Invention

The present invention relates to a composite substrate in which a support substrate made of silicon (Si) and a piezoelectric layer are laminated, and an acoustic wave device including the composite substrate.

2. Description of the Related Art

A composite substrate in which a substrate made of Si and a piezoelectric layer are laminated has been known. For example, WO 2017/109131 discloses a composite substrate in which a second substrate made of silicon is laminated on a first substrate made of a piezoelectric material. In this case, an acoustic wave element is defined by forming an interdigital transducer (IDT) electrode on the first substrate.

In an acoustic wave device including the above-described composite substrate, a spurious response is generated in some cases by a high-order mode located on a higher frequency side relative to a mode to be used.

SUMMARY OF THE INVENTION

Preferred embodiments of the present invention provide composite substrates and acoustic wave devices including the composite substrates, which are each able to reduce or prevent spurious responses by high-order modes.

A composite substrate according to a preferred embodiment of the present invention includes a support substrate made of Si, a piezoelectric layer made of lithium tantalate laminated on the support substrate, a high acoustic velocity film between the support substrate and the piezoelectric layer, in which an acoustic velocity of a bulk wave propagating is higher than an acoustic velocity of an acoustic wave propagating through the piezoelectric layer, and a low acoustic velocity film between the high acoustic velocity film and the piezoelectric layer, in which an acoustic velocity of a bulk wave propagating is lower than an acoustic velocity of a bulk wave propagating through the piezoelectric layer, wherein Euler angles of the Si are within a region indicated by hatching with slant lines in FIG. 4.

A composite substrate according to a preferred embodiment of the present invention includes a support substrate made of Si and a piezoelectric layer laminated on the support substrate, wherein Euler angles of the Si are within any of ranges shown in Tables 1 to 3 below.

TABLE 1

| φ | θ |
|---|---|
| $-90° \leq φ < -89°$ | $-13° \geq θ \geq -16°, -73° \geq θ \geq -75°$ |
| $-89° \leq φ < -88°$ | $-14° \geq θ \geq -15°, -72° \geq θ \geq -75°$ |
| $-88° \leq φ < -87°$ | $-71° \geq θ \geq -75°$ |
| $-87° \leq φ < -86°$ | $-70° \geq θ \geq -75°$ |
| $-86° \leq φ < -85°$ | $-69° \geq θ \geq -80°$ |
| $-85° \leq φ < -84°$ | $-69° \geq θ \geq -80°$ |
| $-84° \leq φ < -83°$ | $-69° \geq θ \geq -79°$ |
| $-83° \leq φ < -82°$ | $-19° \geq θ \geq -22°, -69° \geq θ \geq -74°, -76° \geq θ \geq -77°$ |
| $-82° \leq φ < -81°$ | $-19° \geq θ \geq -22°, -68° \geq θ \geq -74°$ |
| $-81° \leq φ < -80°$ | $-18° \geq θ \geq -22°, -68° \geq θ \geq -73°$ |
| $-80° \leq φ < -79°$ | $-18° \geq θ \geq -22°, -67° \geq θ \geq -73°$ |
| $-79° \leq φ < -78°$ | $-18° \geq θ \geq -22°, -67° \geq θ \geq -74°$ |
| $-78° \leq φ < -77°$ | $-18° \geq θ \geq -22°, -66° \geq θ \geq -75°$ |
| $-77° \leq φ < -76°$ | $-18° \geq θ \geq -22°, -65° \geq θ \geq -75°, -87° \geq θ \geq -88°$ |
| $-76° \leq φ < -75°$ | $-18° \geq θ \geq -22°, -64° \geq θ \geq -75°, -84° \geq θ \geq -90°$ |
| $-75° \leq φ < -74°$ | $-17° \geq θ \geq -21°, -63° \geq θ \geq -77°, -83° \geq θ \geq -90°$ |
| $-74° \leq φ < -73°$ | $-17° \geq θ \geq -21°, -62° \geq θ \geq -78°, -81° \geq θ \geq -86°$ |
| $-73° \leq φ < -72°$ | $-16° \geq θ \geq -21°, -61° \geq θ \geq -79°, -80° \geq θ \geq -87°$ |
| $-72° \leq φ < -71°$ | $-15° \geq θ \geq -21°, -54° \geq θ \geq -59°, -60° \geq θ \geq -87°$ |
| $-71° \leq φ < -70°$ | $-14° \geq θ \geq -30°, -52° \geq θ \geq -88°$ |
| $-70° \leq φ < -69°$ | $-13° \geq θ \geq -30°, -39° \geq θ \geq -40°, -50° \geq θ \geq -88°$ |
| $-69° \leq φ < -68°$ | $-13° \geq θ \geq -29°, -37° \geq θ \geq -40°, -50° \geq θ \geq -88°$ |
| $-68° \leq φ < -67°$ | $-13° \geq θ \geq -29°, -36° \geq θ \geq -40°, -49° \geq θ \geq -77°, -79° \geq θ \geq -88°$ |
| $-67° \leq φ < -66°$ | $-13° \geq θ \geq -28°, -35° \geq θ \geq -40°, -49° \geq θ \geq -75°, -81° \geq θ \geq -88°$ |
| $-66° \leq φ < -65°$ | $-13° \geq θ \geq -28°, -33° \geq θ \geq -40°, -49° \geq θ \geq -73°, -83° \geq θ \geq -87°$ |
| $-65° \leq φ < -64°$ | $-13° \geq θ \geq -28°, -32° \geq θ \geq -40°, -48° \geq θ \geq -64°, -65° \geq θ \geq -72°$ |
| $-64° \leq φ < -63°$ | $-17° \geq θ \geq -28°, -31° \geq θ \geq -40°, -46° \geq θ \geq -61°, -66° \geq θ \geq -73°$ |
| $-63° \leq φ < -62°$ | $-17° \geq θ \geq -40°, -44° \geq θ \geq -49°, -50° \geq θ \geq -59°, -66° \geq θ \geq -73°$ |
| $-62° \leq φ < -61°$ | $-18° \geq θ \geq -40°, -42° \geq θ \geq -49°, -51° \geq θ \geq -57°, -67° \geq θ \geq -72°$ |
| $-61° \leq φ < -60°$ | $-18° \geq θ \geq -49°, -52° \geq θ \geq -56°, -67° \geq θ \geq -72°$ |

TABLE 2

| φ | θ |
|---|---|
| −60° ≤ φ < −59° | −18° ≥ θ ≥ −48°, −52° ≥ θ ≥ −54°, −67° ≥ θ ≥ −73° |
| −59° ≤ φ < −58° | −18° ≥ θ ≥ −48°, −68° ≥ θ ≥ −73° |
| −58° ≤ φ < −57° | −19° ≥ θ ≥ −48°, −67° ≥ θ ≥ −73° |
| −57° ≤ φ < −56° | −19° ≥ θ ≥ −48°, −67° ≥ θ ≥ −73° |
| −56° ≤ φ < −55° | −20° ≥ θ ≥ −48°, −67° ≥ θ ≥ −73° |
| −55° ≤ φ < −54° | −20° ≥ θ ≥ −47°, −67° ≥ θ ≥ −73° |
| −54° ≤ φ < −53° | −20° ≥ θ ≥ −44°, −67° ≥ θ ≥ −73° |
| −53° ≤ φ < −52° | −20° ≥ θ ≥ −43°, −67° ≥ θ ≥ −73° |
| −52° ≤ φ < −51° | −19° ≥ θ ≥ −42°, −67° ≥ θ ≥ −72° |
| −51° ≤ φ < −50° | −19° ≥ θ ≥ −24°, −27° ≥ θ ≥ −41°, −68° ≥ θ ≥ −72° |
| −50° ≤ φ < −49° | −25° ≥ θ ≥ −40°, −68° ≥ θ ≥ −72° |
| −49° ≤ φ < −48° | −24° ≥ θ ≥ −40°, −68° ≥ θ ≥ −72° |
| −48° ≤ φ < −47° | −24° ≥ θ ≥ −40°, −68° ≥ θ ≥ −72° |
| −47° ≤ φ < −46° | −23° ≥ θ ≥ −40°, −68° ≥ θ ≥ −72° |
| −46° ≤ φ < −45° | −23° ≥ θ ≥ −39°, −68° ≥ θ ≥ −72° |
| −45° ≤ φ < −44° | −22° ≥ θ ≥ −39°, −68° ≥ θ ≥ −72° |
| −44° ≤ φ < −43° | −21° ≥ θ ≥ −40°, −68° ≥ θ ≥ −72° |
| −43° ≤ φ < −42° | −19° ≥ θ ≥ −40°, −68° ≥ θ ≥ −72° |
| −42° ≤ φ < −41° | −18° ≥ θ ≥ −40°, −68° ≥ θ ≥ −72° |
| −41° ≤ φ < −40° | −17° ≥ θ ≥ −41°, −67° ≥ θ ≥ −72° |
| −40° ≤ φ < −39° | −17° ≥ θ ≥ −23°, −24° ≥ θ ≥ −41°, −67° ≥ θ ≥ −72° |
| −39° ≤ φ < −38° | −17° ≥ θ ≥ −22°, −23° ≥ θ ≥ −41°, −67° ≥ θ ≥ −72° |
| −38° ≤ φ < −37° | −17° ≥ θ ≥ −21°, −22° ≥ θ ≥ −41°, −67° ≥ θ ≥ −72° |
| −37° ≤ φ < −36° | −19° ≥ θ ≥ −20°, −21° ≥ θ ≥ −45°, −67° ≥ θ ≥ −72° |
| −36° ≤ φ < −35° | −21° ≥ θ ≥ −47°, −68° ≥ θ ≥ −72° |
| −35° ≤ φ < −34° | −20° ≥ θ ≥ −48°, −67° ≥ θ ≥ −72° |
| −34° ≤ φ < −33° | −19° ≥ θ ≥ −48°, −67° ≥ θ ≥ −72° |
| −33° ≤ φ < −32° | −19° ≥ θ ≥ −30°, −34° ≥ θ ≥ −48°, −66° ≥ θ ≥ −72° |
| −32° ≤ φ < −31° | −18° ≥ θ ≥ −29°, −35° ≥ θ ≥ −48°, −65° ≥ θ ≥ −73° |
| −31° ≤ φ < −30° | −18° ≥ θ ≥ −29°, −37° ≥ θ ≥ −48°, −52° ≥ θ ≥ −56°, −64° ≥ θ ≥ −73° |

TABLE 3

| φ | θ |
|---|---|
| −30° ≤ φ < −29° | −17° ≥ θ ≥ −29°, −39° ≥ θ ≥ −48°, −51° ≥ θ ≥ −56°, −63° ≥ θ ≥ −73° |
| −29° ≤ φ < −28° | −16° ≥ θ ≥ −28°, −40° ≥ θ ≥ −47°, −51° ≥ θ ≥ −57°, −61° ≥ θ ≥ −73° |
| −28° ≤ φ < −27° | −15° ≥ θ ≥ −28°, −41° ≥ θ ≥ −46°, −50° ≥ θ ≥ −73° |
| −27° ≤ φ < −26° | −14° ≥ θ ≥ −28°, −50° ≥ θ ≥ −73° |
| −26° ≤ φ < −25° | −13° ≥ θ ≥ −28°, −49° ≥ θ ≥ −73°, −84° ≥ θ ≥ −85° |
| −25° ≤ φ < −24° | −14° ≥ θ ≥ −27°, −49° ≥ θ ≥ −75°, −82° ≥ θ ≥ −85° |
| −24° ≤ φ < −23° | −14° ≥ θ ≥ −27°, −49° ≥ θ ≥ −62°, −63° ≥ θ ≥ −79°, −81° ≥ θ ≥ −86° |
| −23° ≤ φ < −22° | −14° ≥ θ ≥ −26°, −50° ≥ θ ≥ −61°, −63° ≥ θ ≥ −87° |
| −22° ≤ φ < −21° | −14° ≥ θ ≥ −29°, −50° ≥ θ ≥ −60°, −63° ≥ θ ≥ −87° |
| −21° ≤ φ < −20° | −14° ≥ θ ≥ −30°, −51° ≥ θ ≥ −58°, −63° ≥ θ ≥ −88° |
| −20° ≤ φ < −19° | −14° ≥ θ ≥ −25°, −52° ≥ θ ≥ −56°, −64° ≥ θ ≥ −88° |
| −19° ≤ φ < −18° | −14° ≥ θ ≥ −24°, −64° ≥ θ ≥ −79°, −80° ≥ θ ≥ −88° |
| −18° ≤ φ < −17° | −14° ≥ θ ≥ −23°, −64° ≥ θ ≥ −78°, −82° ≥ θ ≥ −89° |
| −17° ≤ φ < −16° | −14° ≥ θ ≥ −22°, −64° ≥ θ ≥ −77°, −85° ≥ θ ≥ −90° |
| −16° ≤ φ < −15° | −14° ≥ θ ≥ −22°, −64° ≥ θ ≥ −76°, −87° ≥ θ ≥ −90° |
| −15° ≤ φ < −14° | −16° ≥ θ ≥ −22°, −64° ≥ θ ≥ −75°, −89° ≥ θ ≥ −90° |
| −14° ≤ φ < −13° | −17° ≥ θ ≥ −22°, −67° ≥ θ ≥ −75° |
| −13° ≤ φ < −12° | −18° ≥ θ ≥ −22°, −68° ≥ θ ≥ −75° |
| −12° ≤ φ < −11° | −18° ≥ θ ≥ −25°, −68° ≥ θ ≥ −75° |
| −11° ≤ φ < −10° | −18° ≥ θ ≥ −25°, −68° ≥ θ ≥ −74° |
| −10° ≤ φ < −9° | −18° ≥ θ ≥ −25°, −67° ≥ θ ≥ −73° |
| −9° ≤ φ < −8° | −17° ≥ θ ≥ −25°, −67° ≥ θ ≥ −72° |
| −8° ≤ φ < −7° | −18° ≥ θ ≥ −20°, −66° ≥ θ ≥ −71°, −74° ≥ θ ≥ −75° |
| −7° ≤ φ < −6° | −68° ≥ θ ≥ −70°, −73° ≥ θ ≥ −75° |
| −6° ≤ φ < −5° | −72° ≥ θ ≥ −80° |
| −5° ≤ φ < −4° | −73° ≥ θ ≥ −80° |
| −4° ≤ φ < −3° | −74° ≥ θ ≥ −79° |
| −3° ≤ φ < −2° | −73° ≥ θ ≥ −78° |
| −2° ≤ φ < −1° | −14° ≥ θ ≥ −16°, −73° ≥ θ ≥ −77° |
| −1° ≤ φ < 0° | −14° ≥ θ ≥ −16°, −73° ≥ θ ≥ −76° |

An acoustic wave device according to a preferred embodiment of the present invention includes a composite substrate according to a preferred embodiment of the present invention, and an IDT electrode in contact with the piezoelectric layer of the composite substrate.

When acoustic wave devices include composite substrates according to preferred embodiments of the present invention, spurious responses by high-order modes are able to be reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be clarified by describing preferred embodiments of the present invention with reference to the drawings.

Each preferred embodiment described in the present specification is illustrative, and partial replacement or combination of configurations can be provided between different preferred embodiments.

Figure 1:
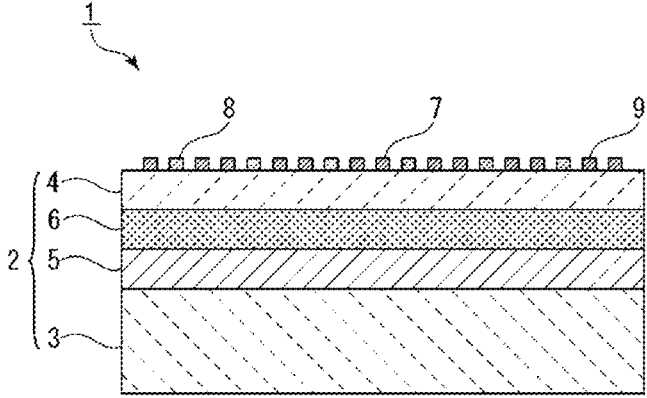
FIG. 1 is a front cross-sectional view of an acoustic wave device according to a first preferred embodiment of the present invention.
Figure 2:
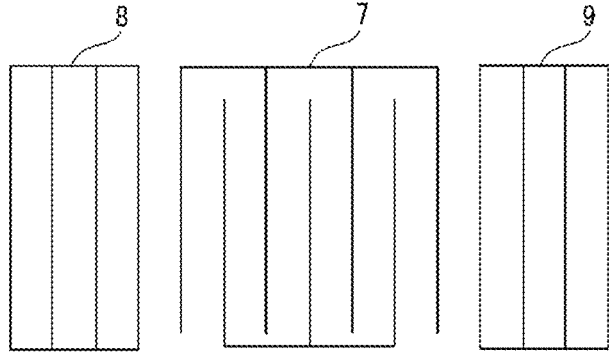
FIG. 2 is a schematic plan view illustrating an electrode structure of an acoustic wave device according to the first preferred embodiment of the present invention.

FIG. 1 is a front cross-sectional view of an acoustic wave device according to a first preferred embodiment of the present invention, and FIG. 2 is a schematic plan view illustrating an electrode structure of the acoustic wave device.

An acoustic wave device 1 includes a composite substrate 2. The composite substrate 2 includes a support substrate 3 made of Si and a piezoelectric layer 4 indirectly laminated on the support substrate 3. Between the support substrate 3 and the piezoelectric layer 4, a high acoustic velocity material layer 5 as a high acoustic velocity film and a low acoustic velocity film 6 are laminated. An IDT electrode 7 is provided on an upper surface of the piezoelectric layer 4, that is, on a surface on the opposite side to the support substrate 3 so as to be in contact with the piezoelectric layer 4. Reflectors 8 and 9 are provided on both sides in an acoustic wave propagation direction of the IDT electrode 7. Thus, a one-port acoustic wave resonator is provided. However, the electrode structure is not limited thereto as long as the IDT electrode is provided. For example, an electrode structure defining a longitudinally coupled resonator acoustic wave filter may be provided.

The high acoustic velocity material layer 5 is made of, for example, a SiN film in the present preferred embodiment. However, the high acoustic velocity material layer 5 may be made of various high acoustic velocity materials in which the acoustic velocity of a propagating bulk wave is higher than the acoustic velocity of an acoustic wave propagating through the piezoelectric layer 4. As the high acoustic velocity materials described above, various materials such as, for example, aluminum oxide, silicon carbide, silicon nitride, silicon oxynitride, silicon, sapphire, lithium tantalate, lithium niobate, quartz, alumina, zirconia, cordierite, mullite, steatite, forsterite, magnesia, a diamond-like carbon (DLC) film, or diamond, a medium mainly including the above materials, a medium mainly including a mixture of the above materials and the like may be used.

The low acoustic velocity film 6 is made of, for example, a $SiO_2$ film. However, the low acoustic velocity film 6 may be made of various low acoustic velocity materials. Examples of such low acoustic velocity materials include various materials in which the acoustic velocity of a propagating bulk wave is lower than the acoustic velocity of a bulk wave propagating through the piezoelectric layer 4. As the low acoustic velocity materials, for example, various materials such as silicon oxide, glass, silicon oxynitride, tantalum oxide, a compound obtained by adding fluorine, carbon, boron, hydrogen, or a silanol group to silicon oxide, a medium mainly including the above materials and the like may be used.

Figure 4:
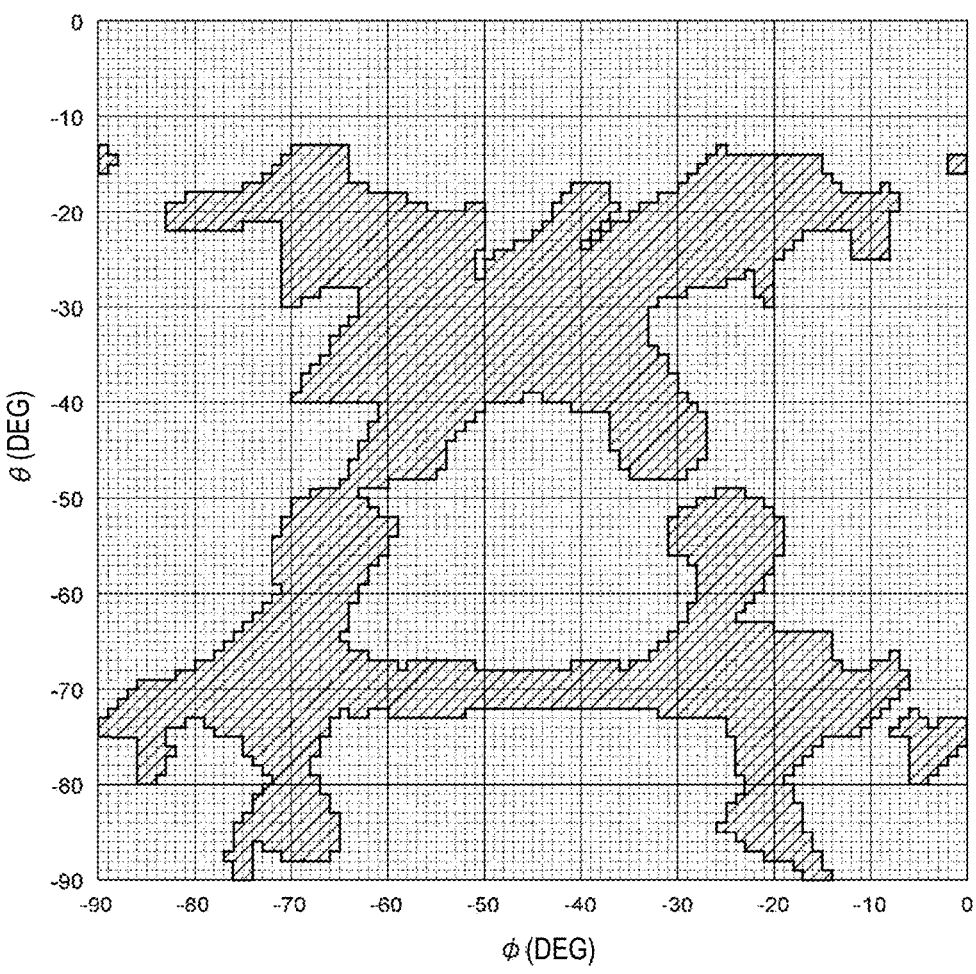
FIG. 4 is a diagram depicting regions in which high-order mode spurious responses may be reduced or prevented.

A preferred embodiment of the present invention includes a feature that, in the composite substrate 2 of the acoustic wave device 1, Euler angles of Si fall within regions indicated by hatching with slant lines in FIG. 4. This makes it possible to effectively reduce or prevent spurious responses of high-order modes. This will be more specifically described below.

When a composite substrate of related art including a piezoelectric layer and a support substrate made of Si is used, in a case where the thickness of the piezoelectric layer is small, a high-order mode is generated on a higher frequency side of the band. In particular, it has been discovered that there is a problem that a high-order mode is likely to appear near a frequency of about 1.5 times or about 2.2 times the band. In this case, the band is a frequency range between a resonant frequency and an anti-resonant frequency of the acoustic wave resonator as the acoustic wave device, and a high-order mode is likely to be generated near about 1.5 times or about 2.2 times the resonant frequency.

The inventor of preferred embodiments of the present application has discovered for the first time that the above-described high-order mode may be reduced or prevented by selecting the crystal orientation of Si in the above-described composite substrate, and have developed the present invention.

Specifically, with regard to the acoustic wave device 1 having a configuration described below, phase characteristics of a high-order mode in a frequency range of about three times or less the band were obtained.

Configuration of Composite Substrate 2: a SiN film with a thickness of about $0.15\lambda$, a $SiO_2$ film with a thickness of about $0.15\lambda$, and a $LiTaO_3$ film as the piezoelectric layer with a thickness of about $0.2\lambda$ being laminated on the support substrate 3 made of Si. Note that $\lambda$ is a wavelength determined by an electrode finger pitch of the IDT electrode 7. The Euler angles of $LiTaO_3$ are (about 0°, about 130°, about 0°).

Material of IDT Electrode 7 and Reflectors 8, 9: Al with a thickness of about $0.05\lambda$. Duty=about 0.5, $\lambda$=about 1 μm.

With respect to the above-described configuration, the Euler angles ($\varphi$, $\theta$, $\psi$) of the support substrate 3 made of Si were changed in the following ranges.

$\varphi$: from about −90° to about 0°
$\theta$: from about −90° to about 0°
$\psi$: from about −180° to about 180°

Figure 3:
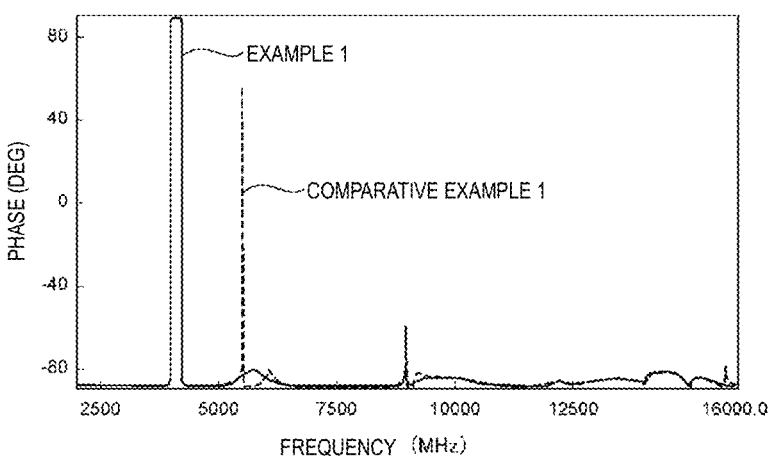
FIG. 3 is a graph depicting phase-frequency characteristics of acoustic wave devices according to Example 1 of a preferred embodiment of the present invention and Comparative Example 1.

Then, a relationship between the Euler angles of the support substrate 3 made of Si and the phase of the high-order mode of about 1.5 times was obtained. FIG. 3 depicts phase-frequency characteristics of acoustic wave devices according to Example 1 of a preferred embodiment of the present invention and Comparative Example 1 as an example. The Euler angles of the support substrate made of Si are (about −18°, about −23°, about) 104° in Example 1, and (about 0°, about 0°, about 45°) in Comparative Example 1.

In FIG. 3, a solid line indicates the phase-frequency characteristics of Example 1, while a broken line indicates the phase-frequency characteristics of Comparative Example 1.

In this case, the resonant frequency of the acoustic wave device of Example 1 is about 4000 MHz, and the resonant frequency of the acoustic wave device of Comparative Example 1 is about 4000 MHz. In Example 1, a response of the high-order mode of about 1.5 times appears near about 5700 MHz. In Comparative Example 1, a response of the high-order mode of about 1.5 times appears near about 5560

MHz. The intensity of the response of the high-order mode of about 1.5 times (that is, as is clear from comparison of the magnitude of the phases) is about −80° or less, and may be significantly reduced according to Example 1 compared to Comparative Example 1.

Then, the orientation of the support substrate made of Si was changed as follows, and a range in which the phase of the high-order mode of about 1.5 times was about −80° or less was investigated. As a result, it has been found that the high-order mode of about 1.5 times may be reduced to be less than or equal to about −80° within the regions indicated by hatching in FIG. 4.

The ranges depicted in FIG. 4 are shown in Tables 4 to 6 below. As is clear from the contents described in Tables 4 to 6, it is understood that it is sufficient to use the support substrate made of Si of φ and θ within the ranges shown in the tables.

TABLE 4

| φ | θ |
|---|---|
| −90° ≤ φ < −89° | −13° ≥ θ ≥ −16°, −73° ≥ θ ≥ −75° |
| −89° ≤ φ < −88° | −14° ≥ θ ≥ −15°, −72° ≥ θ ≥ −75° |
| −88° ≤ φ < −87° | −71° ≥ θ ≥ −75° |
| −87° ≤ φ < −86° | −70° ≥ θ ≥ −75° |
| −86° ≤ φ < −85° | −69° ≥ θ ≥ −80° |
| −85° ≤ φ < −84° | −69° ≥ θ ≥ −80° |
| −84° ≤ φ < −83° | −69° ≥ θ ≥ −79° |
| −83° ≤ φ < −82° | −19° ≥ θ ≥ −22°, −69° ≥ θ ≥ −74°, −76° ≥ θ ≥ −77° |
| −82° ≤ φ < −81° | −19° ≥ θ ≥ −22°, −68° ≥ θ ≥ −74° |
| −81° ≤ φ < −80° | −18° ≥ θ ≥ −22°, −68° ≥ θ ≥ −73° |
| −80° ≤ φ < −79° | −18° ≥ θ ≥ −22°, −67° ≥ θ ≥ −73° |
| −79° ≤ φ < −78° | −18° ≥ θ ≥ −22°, −67° ≥ θ ≥ −74° |
| −78° ≤ φ < −77° | −18° ≥ θ ≥ −22°, −66° ≥ θ ≥ −75° |
| −77° ≤ φ < −76° | −18° ≥ θ ≥ −22°, −65° ≥ θ ≥ −75°, −87° ≥ θ ≥ −88° |
| −76° ≤ φ < −75° | −18° ≥ θ ≥ −22°, −64° ≥ θ ≥ −75°, −84° ≥ θ ≥ −90° |
| −75° ≤ φ < −74° | −17° ≥ θ ≥ −21°, −63° ≥ θ ≥ −77°, −83° ≥ θ ≥ −90° |
| −74° ≤ φ < −73° | −17° ≥ θ ≥ −21°, −62° ≥ θ ≥ −78°, −81° ≥ θ ≥ −86° |
| −73° ≤ φ < −72° | −16° ≥ θ ≥ −21°, −61° ≥ θ ≥ −79°, −80° ≥ θ ≥ −87° |
| −72° ≤ φ < −71° | −15° ≥ θ ≥ −21°, −54° ≥ θ ≥ −59°, −60° ≥ θ ≥ −87° |
| −71° ≤ φ < −70° | −14° ≥ θ ≥ −30°, −52° ≥ θ ≥ −88° |
| −70° ≤ φ < −69° | −13° ≥ θ ≥ −30°, −39° ≥ θ ≥ −40°, −50° ≥ θ ≥ −88° |
| −69° ≤ φ < −68° | −13° ≥ θ ≥ −29°, −37° ≥ θ ≥ −40°, −50° ≥ θ ≥ −88° |
| −68° ≤ φ < −67° | −13° ≥ θ ≥ −29°, −36° ≥ θ ≥ −40°, −49° ≥ θ ≥ −77°, −79° ≥ θ ≥ −88° |
| −67° ≤ φ < −66° | −13° ≥ θ ≥ −28°, −35° ≥ θ ≥ −40°, −49° ≥ θ ≥ −75°, −81° ≥ θ ≥ −88° |
| −66° ≤ φ < −65° | −13° ≥ θ ≥ −28°, −33° ≥ θ ≥ −40°, −49° ≥ θ ≥ −73°, −83° ≥ θ ≥ −87° |
| −65° ≤ φ < −64° | −13° ≥ θ ≥ −28°, −32° ≥ θ ≥ −40°, −48° ≥ θ ≥ −64°, −65° ≥ θ ≥ −72° |
| −64° ≤ φ < −63° | −17° ≥ θ ≥ −28°, −31° ≥ θ ≥ −40°, −46° ≥ θ ≥ −61°, −66° ≥ θ ≥ −73° |
| −63° ≤ φ < −62° | −17° ≥ θ ≥ −40°, −44° ≥ θ ≥ −49°, −50° ≥ θ ≥ −59°, −66° ≥ θ ≥ −73° |
| −62° ≤ φ < −61° | −18° ≥ θ ≥ −40°, −42° ≥ θ ≥ −49°, −51° ≥ θ ≥ −57°, −67° ≥ θ ≥ −72° |
| −61° ≤ φ < −60° | −18° ≥ θ ≥ −49°, −52° ≥ θ ≥ −56°, −67° ≥ θ ≥ −72° |

TABLE 5

| φ | θ |
|---|---|
| −60° ≤ φ < −59° | −18° ≥ θ ≥ −48°, −52° ≥ θ ≥ −54°, −67° ≥ θ ≥ −73° |
| −59° ≤ φ < −58° | −18° ≥ θ ≥ −48°, −68° ≥ θ ≥ −73° |
| −58° ≤ φ < −57° | −19° ≥ θ ≥ −48°, −67° ≥ θ ≥ −73° |
| −57° ≤ φ < −56° | −19° ≥ θ ≥ −48°, −67° ≥ θ ≥ −73° |
| −56° ≤ φ < −55° | −20° ≥ θ ≥ −48°, −67° ≥ θ ≥ −73° |
| −55° ≤ φ < −54° | −20° ≥ θ ≥ −47°, −67° ≥ θ ≥ −73° |
| −54° ≤ φ < −53° | −20° ≥ θ ≥ −44°, −67° ≥ θ ≥ −73° |
| −53° ≤ φ < −52° | −20° ≥ θ ≥ −43°, −67° ≥ θ ≥ −73° |
| −52° ≤ φ < −51° | −19° ≥ θ ≥ −42°, −67° ≥ θ ≥ −72° |
| −51° ≤ φ < −50° | −19° ≥ θ ≥ −24°, −27° ≥ θ ≥ −41°, −68° ≥ θ ≥ −72° |
| −50° ≤ φ < −49° | −25° ≥ θ ≥ −40°, −68° ≥ θ ≥ −72° |
| −49° ≤ φ < −48° | −24° ≥ θ ≥ −40°, −68° ≥ θ ≥ −72° |
| −48° ≤ φ < −47° | −24° ≥ θ ≥ −40°, −68° ≥ θ ≥ −72° |
| −47° ≤ φ < −46° | −23° ≥ θ ≥ −40°, −68° ≥ θ ≥ −72° |
| −46° ≤ φ < −45° | −23° ≥ θ ≥ −39°, −68° ≥ θ ≥ −72° |
| −45° ≤ φ < −44° | −22° ≥ θ ≥ −39°, −68° ≥ θ ≥ −72° |
| −44° ≤ φ < −43° | −21° ≥ θ ≥ −40°, −68° ≥ θ ≥ −72° |

TABLE 5-continued

| φ | θ |
|---|---|
| -43° ≤ φ < -42° | -19° ≥ θ ≥ -40°, -68° ≥ θ ≥ -72° |
| -42° ≤ φ < -41° | -18° ≥ θ ≥ -40°, -68° ≥ θ ≥ -72° |
| -41° ≤ φ < -40° | -17° ≥ θ ≥ -41°, -67° ≥ θ ≥ -72° |
| -40° ≤ φ < -39° | -17° ≥ θ ≥ -23°, -24° ≥ θ ≥ -41°, -67° ≥ θ ≥ -72° |
| -39° ≤ φ < -38° | -17° ≥ θ ≥ -22°, -23° ≥ θ ≥ -41°, -67° ≥ θ ≥ -72° |
| -38° ≤ φ < -37° | -17° ≥ θ ≥ -21°, -22° ≥ θ ≥ -41°, -67° ≥ θ ≥ -72° |
| -37° ≤ φ < -36° | -19° ≥ θ ≥ -20°, -21° ≥ θ ≥ -45°, -67° ≥ θ ≥ -72° |
| -36° ≤ φ < -35° | -21° ≥ θ ≥ -47°, -68° ≥ θ ≥ -72° |
| -35° ≤ φ < -34° | -20° ≥ θ ≥ -48°, -67° ≥ θ ≥ -72° |
| -34° ≤ φ < -33° | -19° ≥ θ ≥ -48°, -67° ≥ θ ≥ -72° |
| -33° ≤ φ < -32° | -19° ≥ θ ≥ -30°, -34° ≥ θ ≥ -48°, -66° ≥ θ ≥ -72° |
| -32° ≤ φ < -31° | -18° ≥ θ ≥ -29°, -35° ≥ θ ≥ -48°, -65° ≥ θ ≥ -73° |
| -31° ≤ φ < -30° | -18° ≥ θ ≥ -29°, -37° ≥ θ ≥ -48°, -52° ≥ θ ≥ -56°, -64° ≥ θ ≥ -73° |

TABLE 6

| φ | θ |
|---|---|
| -30° ≤ φ < -29° | -17° ≥ θ ≥ -29°, -39° ≥ θ ≥ -48°, -51° ≥ θ ≥ -56°, -63° ≥ θ ≥ -73° |
| -29° ≤ φ < -28° | -16° ≥ θ ≥ -28°, -40° ≥ θ ≥ -47°, -51° ≥ θ ≥ -57°, -61° ≥ θ ≥ -73° |
| -28° ≤ φ < -27° | -15° ≥ θ ≥ -28°, -41° ≥ θ ≥ -46°, -50° ≥ θ ≥ -73° |
| -27° ≤ φ < -26° | -14° ≥ θ ≥ -28°, -50° ≥ θ ≥ -73° |
| -26° ≤ φ < -25° | -13° ≥ θ ≥ -28°, -49° ≥ θ ≥ -73°, -84° ≥ θ ≥ -85° |
| -25° ≤ φ < -24° | -14° ≥ θ ≥ -27°, -49° ≥ θ ≥ -75°, -82° ≥ θ ≥ -85° |
| -24° ≤ φ < -23° | -14° ≥ θ ≥ -27°, -49° ≥ θ ≥ -62°, -63° ≥ θ ≥ -79°, -81° ≥ θ ≥ -86° |
| -23° ≤ φ < -22° | -14° ≥ θ ≥ -26°, -50° ≥ θ ≥ -61°, -63° ≥ θ ≥ -87° |
| -22° ≤ φ < -21° | -14° ≥ θ ≥ -29°, -50° ≥ θ ≥ -60°, -63° ≥ θ ≥ -87° |
| -21° ≤ φ < -20° | -14° ≥ θ ≥ -30°, -51° ≥ θ ≥ -58°, -63° ≥ θ ≥ -88° |
| -20° ≤ φ < -19° | -14° ≥ θ ≥ -25°, -52° ≥ θ ≥ -56°, -64° ≥ θ ≥ -88° |
| -19° ≤ φ < -18° | -14° ≥ θ ≥ -24°, -64° ≥ θ ≥ -79°, -80° ≥ θ ≥ -88° |
| -18° ≤ φ < -17° | -14° ≥ θ ≥ -23°, -64° ≥ θ ≥ -78°, -82° ≥ θ ≥ -89° |
| -17° ≤ φ < -16° | -14° ≥ θ ≥ -22°, -64° ≥ θ ≥ -77°, -85° ≥ θ ≥ -90° |
| -16° ≤ φ < -15° | -14° ≥ θ ≥ -22°, -64° ≥ θ ≥ -76°, -87° ≥ θ ≥ -90° |
| -15° ≤ φ < -14° | -16° ≥ θ ≥ -22°, -64° ≥ θ ≥ -75°, -89° ≥ θ ≥ -90° |
| -14° ≤ φ < -13° | -17° ≥ θ ≥ -22°, -67° ≥ θ ≥ -75° |
| -13° ≤ φ < -12° | -18° ≥ θ ≥ -22°, -68° ≥ θ ≥ -75° |
| -12° ≤ φ < -11° | -18° ≥ θ ≥ -25°, -68° ≥ θ ≥ -75° |
| -11° ≤ φ < -10° | -18° ≥ θ ≥ -25°, -68° ≥ θ ≥ -74° |
| -10° ≤ φ < -9° | -18° ≥ θ ≥ -25°, -67° ≥ θ ≥ -73° |
| -9° ≤ φ < -8° | -17° ≥ θ ≥ -25°, -67° ≥ θ ≥ -72° |
| -8° ≤ φ < -7° | -18° ≥ θ ≥ -20°, -66° ≥ θ ≥ -71°, -74° ≥ θ ≥ -75° |
| -7° ≤ φ < -6° | -68° ≥ θ ≥ -70°, -73° ≥ θ ≥ -75° |
| -6° ≤ φ < -5° | -72° ≥ θ ≥ -80° |
| -5° ≤ φ < -4° | -73° ≥ θ ≥ -80° |
| -4° ≤ φ < -3° | -74° ≥ θ ≥ -79° |
| -3° ≤ φ < -2° | -73° ≥ θ ≥ -78° |
| -2° ≤ φ < -1° | -14° ≥ θ ≥ -16°, -73° ≥ θ ≥ -77° |
| -1° ≤ φ < 0° | -14° ≥ θ ≥ -16°, -73° ≥ θ ≥ -76° |

Preferably, in the Euler angles ((φ, θ, ψ) of the support substrate made of Si, when φ is about -25° or more and about -15° or less, and θ is about -22° or more and about -14° or less, the phase of the high-order mode of about 1.5 times may be reduced or prevented to be less than or equal to about -81°.

Example 2

With regard to the acoustic wave device of Example 2, a relationship between a longitudinal wave acoustic velocity of Si and a phase of a high-order mode generated near a frequency position of about 2.2 times the own band was obtained. The result is depicted in FIG. 5.

Figure 5:
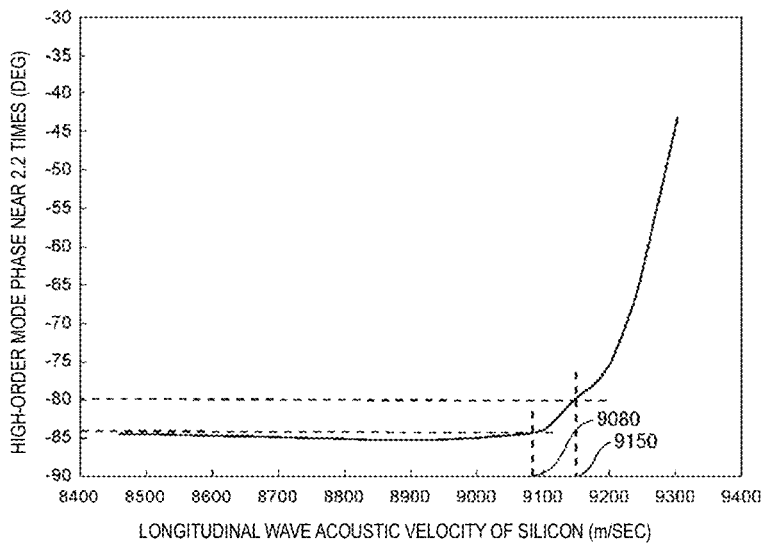
FIG. 5 is a graph depicting a relationship between a longitudinal wave acoustic velocity of silicon and a phase of a high-order mode generated near 2.2 times the own band.

As is clear from FIG. 5, in a case where the longitudinal wave acoustic velocity of Si is less than or equal to about 9150 m/sec, and φ and θ of Si are other than 0°, the phase of the high-order mode in the vicinity of about 2.2 times the band may be less than or equal to about -80°. In a case where the longitudinal wave acoustic velocity is less than or equal to about 9080 m/sec, the phase of the high-order mode in the vicinity of 2.2 times the own band may be less than or equal to about -84°, and a variation in the phase of the high-order mode is small with respect to a variation in the longitudinal wave acoustic velocity. Accordingly, it is more preferable that the longitudinal wave acoustic velocity is less than or equal to about 9080 m/sec.

Figure 6:
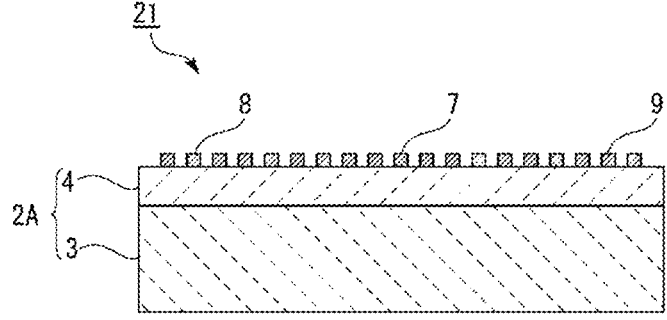
FIG. 6 is a front cross-sectional view of an acoustic wave device according to a second preferred embodiment of the present invention.

FIG. 6 is a front cross-sectional view of an acoustic wave device according to a second preferred embodiment of the present invention. In an acoustic wave device 21, a composite substrate 2A has a structure in which a piezoelectric layer 4 is directly laminated on a support substrate 3 made of Si. As described above, the high acoustic velocity material layer 5 and the low acoustic velocity film 6 illustrated in FIG. 1 may be omitted. Further, in the configuration illustrated in FIG. 1, the high acoustic velocity material layer 5 may be omitted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

11

What is claimed is:

1. A composite substrate, comprising:
a support substrate made of Si; and
a piezoelectric layer laminated on the support substrate;
wherein
Euler angles of the Si are within any of ranges in Tables 1 to 3 below:

TABLE 1

| φ | θ |
|---|---|
| −90° ≤ φ < −89° | −13° ≥ θ ≥ −16°, −73° ≥ θ ≥ −75° |
| −89° ≤ φ < −88° | −14° ≥ θ ≥ −15°, −72° ≥ θ ≥ −75° |
| −88° ≤ φ < −87° | −71° ≥ θ ≥ −75° |
| −87° ≤ φ < −86° | −70° ≥ θ ≥ −75° |
| −86° ≤ φ < −85° | −69° ≥ θ ≥ −80° |
| −85° ≤ φ < −84° | −69° ≥ θ ≥ −80° |
| −84° ≤ φ < −83° | −69° ≥ θ ≥ −79° |
| −83° ≤ φ < −82° | −19° ≥ θ ≥ −22°, −69° ≥ θ ≥ −74°, −76° ≥ θ ≥ −77° |
| −82° ≤ φ < −81° | −19° ≥ θ ≥ −22°, −68° ≥ θ ≥ −74° |
| −81° ≤ φ < −80° | −18° ≥ θ ≥ −22°, −68° ≥ θ ≥ −73° |
| −80° ≤ φ < −79° | −18° ≥ θ ≥ −22°, −67° ≥ θ ≥ −73° |
| −79° ≤ φ < −78° | −18° ≥ θ ≥ −22°, −67° ≥ θ ≥ −74° |
| −78° ≤ φ < −77° | −18° ≥ θ ≥ −22°, −66° ≥ θ ≥ −75° |
| −77° ≤ φ < −76° | −18° ≥ θ ≥ −22°, −65° ≥ θ ≥ −75°, −87° ≥ θ ≥ −88° |
| −76° ≤ φ < −75° | −18° ≥ θ ≥ −22°, −64° ≥ θ ≥ −75°, −84° ≥ θ ≥ −90° |
| −75° ≤ φ < −74° | −17° ≥ θ ≥ −21°, −63° ≥ θ ≥ −77°, −83° ≥ θ ≥ −90° |
| −74° ≤ φ < −73° | −17° ≥ θ ≥ −21°, −62° ≥ θ ≥ −78°, −81° ≥ θ ≥ −86° |
| −73° ≤ φ < −72° | −16° ≥ θ ≥ −21°, −61° ≥ θ ≥ −79°, −80° ≥ θ ≥ −87° |
| −72° ≤ φ < −71° | −15° ≥ θ ≥ −21°, −54° ≥ θ ≥ −59°, −60° ≥ θ ≥ −87° |
| −71° ≤ φ < −70° | −14° ≥ θ ≥ −30°, −52° ≥ θ ≥ −88° |
| −70° ≤ φ < −69° | −13° ≥ θ ≥ −30°, −39° ≥ θ ≥ −40°, −50° ≥ θ ≥ −88° |
| −69° ≤ φ < −68° | −13° ≥ θ ≥ −29°, −37° ≥ θ ≥ −40°, −50° ≥ θ ≥ −88° |
| −68° ≤ φ < −67° | −13° ≥ θ ≥ −29°, −36° ≥ θ ≥ −40°, −49° ≥ θ ≥ −77°, −79° ≥ θ ≥ −88° |
| −67° ≤ φ < −66° | −13° ≥ θ ≥ −28°, −35° ≥ θ ≥ −40°, −49° ≥ θ ≥ −75°, −81° ≥ θ ≥ −88° |
| −66° ≤ φ < −65° | −13° ≥ θ ≥ −28°, −33° ≥ θ ≥ −40°, −49° ≥ θ ≥ −73°, −83° ≥ θ ≥ −87° |
| −65° ≤ φ < −64° | −13° ≥ θ ≥ −28°, −32° ≥ θ ≥ −40°, −48° ≥ θ ≥ −64°, −65° ≥ θ ≥ −72° |
| −64° ≤ φ < −63° | −17° ≥ θ ≥ −28°, −31° ≥ θ ≥ −40°, −46° ≥ θ ≥ −61°, −66° ≥ θ ≥ −73° |
| −63° ≤ φ < −62° | −17° ≥ θ ≥ −40°, −44° ≥ θ ≥ −49°, −50° ≥ θ ≥ −59°, −66° ≥ θ ≥ −73° |
| −62° ≤ φ < −61° | −18° ≥ θ ≥ −40°, −42° ≥ θ ≥ −49°, −51° ≥ θ ≥ −57°, −67° ≥ θ ≥ −72° |
| −61° ≤ φ < −60° | −18° ≥ θ ≥ −49°, −52° ≥ θ ≥ −56°, −67° ≥ θ ≥ −72° |

TABLE 2

| φ | θ |
|---|---|
| −60° ≤ φ < −59° | −18° ≥ θ ≥ −48°, −52° ≥ θ ≥ −54°, −67° ≥ θ ≥ −73° |
| −59° ≤ φ < −58° | −18° ≥ θ ≥ −48°, −68° ≥ θ ≥ −73° |
| −58° ≤ φ < −57° | −19° ≥ θ ≥ −48°, −67° ≥ θ ≥ −73° |
| −57° ≤ φ < −56° | −19° ≥ θ ≥ −48°, −67° ≥ θ ≥ −73° |
| −56° ≤ φ < −55° | −20° ≥ θ ≥ −48°, −67° ≥ θ ≥ −73° |
| −55° ≤ φ < −54° | −20° ≥ θ ≥ −47°, −67° ≥ θ ≥ −73° |
| −54° ≤ φ < −53° | −20° ≥ θ ≥ −44°, −67° ≥ θ ≥ −73° |
| −53° ≤ φ < −52° | −20° ≥ θ ≥ −43°, −67° ≥ θ ≥ −73° |
| −52° ≤ φ < −51° | −19° ≥ θ ≥ −42°, −67° ≥ θ ≥ −72° |
| −51° ≤ φ < −50° | −19° ≥ θ ≥ −24°, −27° ≥ θ ≥ −41°, −68° ≥ θ ≥ −72° |
| −50° ≤ φ < −49° | −25° ≥ θ ≥ −40°, −68° ≥ θ ≥ −72° |
| −49° ≤ φ < −48° | −24° ≥ θ ≥ −40°, −68° ≥ θ ≥ −72° |
| −48° ≤ φ < −47° | −24° ≥ θ ≥ −40°, −68° ≥ θ ≥ −72° |
| −47° ≤ φ < −46° | −23° ≥ θ ≥ −40°, −68° ≥ θ ≥ −72° |
| −46° ≤ φ < −45° | −23° ≥ θ ≥ −39°, −68° ≥ θ ≥ −72° |
| −44° ≤ φ < −43° | −21° ≥ θ ≥ −40°, −68° ≥ θ ≥ −72° |
| −43° ≤ φ < −42° | −19° ≥ θ ≥ −40°, −68° ≥ θ ≥ −72° |
| −42° ≤ φ < −41° | −18° ≥ θ ≥ −40°, −68° ≥ θ ≥ −72° |
| −41° ≤ φ < −40° | −17° ≥ θ ≥ −41°, −67° ≥ θ ≥ −72° |
| −40° ≤ φ < −39° | −17° ≥ θ ≥ −23°, −24° ≥ θ ≥ −41°, −67° ≥ θ ≥ −72° |
| −39° ≤ φ < −38° | −17° ≥ θ ≥ −22°, −23° ≥ θ ≥ −41°, −67° ≥ θ ≥ −72° |
| −38° ≤ φ < −37° | −17° ≥ θ ≥ −21°, −22° ≥ θ ≥ −41°, −67° ≥ θ ≥ −72° |
| −37° ≤ φ < −36° | −19° ≥ θ ≥ −20°, −21° ≥ θ ≥ −45°, −67° ≥ θ ≥ −72° |
| −36° ≤ φ < −35° | −21° ≥ θ ≥ −47°, −68° ≥ θ ≥ −72° |

12

TABLE 2-continued

| φ | θ |
|---|---|
| −35° ≤ φ < −34° | −20° ≥ θ ≥ −48°, −67° ≥ θ ≥ −72° |
| −34° ≤ φ < −33° | −19° ≥ θ ≥ −48°, −67° ≥ θ ≥ −72° |
| −33° ≤ φ < −32° | −19° ≥ θ ≥ −30°, −34° ≥ θ ≥ −48°, −66° ≥ θ ≥ −72° |
| −32° ≤ φ < −31° | −18° ≥ θ ≥ −29°, −35° ≥ θ ≥ −48°, −65° ≥ θ ≥ −73° |
| −31° ≤ φ < −30° | −18° ≥ θ ≥ −29°, −37° ≥ θ ≥ −48°, −52° ≥ θ ≥ −56°, −64° ≥ θ ≥ −73° |

TABLE 3

| φ | θ |
|---|---|
| −30° ≤ φ < −29° | −17° ≥ θ ≥ −29°, −39° ≥ θ ≥ −48°, −51° ≥ θ ≥ −56°, −63° ≥ θ ≥ −73° |
| −29° ≤ φ < −28° | −16° ≥ θ ≥ −28°, −40° ≥ θ ≥ −47°, −51° ≥ θ ≥ −57°, −61° ≥ θ ≥ −73° |
| −28° ≤ φ < −27° | −15° ≥ θ ≥ −28°, −41° ≥ θ ≥ −46°, −50° ≥ θ ≥ −73° |
| −27° ≤ φ < −26° | −14° ≥ θ ≥ −28°, −50° ≥ θ ≥ −73° |
| −26° ≤ φ < −25° | −13° ≥ θ ≥ −28°, −49° ≥ θ ≥ −73°, −84° ≥ θ ≥ −85° |
| −25° ≤ φ < −24° | −14° ≥ θ ≥ −27°, −49° ≥ θ ≥ −75°, −82° ≥ θ ≥ −85° |
| −24° ≤ φ < −23° | −14° ≥ θ ≥ −27°, −49° ≥ θ ≥ −62°, −63° ≥ θ ≥ −79°, −81° ≥ θ ≥ −86° |
| −23° ≤ φ < −22° | −14° ≥ θ ≥ −26°, −50° ≥ θ ≥ −61°, −63° ≥ θ ≥ −87° |
| −22° ≤ φ < −21° | −14° ≥ θ ≥ −29°, −50° ≥ θ ≥ −60°, −63° ≥ θ ≥ −87° |
| −21° ≤ φ < −20° | −14° ≥ θ ≥ −30°, −51° ≥ θ ≥ −58°, −63° ≥ θ ≥ −88° |
| −20° ≤ φ < −19° | −14° ≥ θ ≥ −25°, −52° ≥ θ ≥ −56°, −64° ≥ θ ≥ −88° |
| −19° ≤ φ < −18° | −14° ≥ θ ≥ −24°, −64° ≥ θ ≥ −79°, −80° ≥ θ ≥ −88° |
| −18° ≤ φ < −17° | −14° ≥ θ ≥ −23°, −64° ≥ θ ≥ −78°, −82° ≥ θ ≥ −89° |
| −17° ≤ φ < −16° | −14° ≥ θ ≥ −22°, −64° ≥ θ ≥ −77°, −85° ≥ θ ≥ −90° |
| −16° ≤ φ < −15° | −14° ≥ θ ≥ −22°, −64° ≥ θ ≥ −76°, −87° ≥ θ ≥ −90° |
| −15° ≤ φ < −14° | −16° ≥ θ ≥ −22°, −64° ≥ θ ≥ −75°, −89° ≥ θ ≥ −90° |
| −14° ≤ φ < −13° | −17° ≥ θ ≥ −22°, −67° ≥ θ ≥ −75° |
| −13° ≤ φ < −12° | −18° ≥ θ ≥ −22°, −68° ≥ θ ≥ −75° |
| −12° ≤ φ < −11° | −18° ≥ θ ≥ −25°, −68° ≥ θ ≥ −75° |
| −11° ≤ φ < −10° | −18° ≥ θ ≥ −25°, −68° ≥ θ ≥ −74° |
| −10° ≤ φ < −9° | −18° ≥ θ ≥ −25°, −67° ≥ θ ≥ −73° |
| −9° ≤ φ < −8° | −17° ≥ θ ≥ −25°, −67° ≥ θ ≥ −72° |
| −8° ≤ φ < −7° | −18° ≥ θ ≥ −20°, −66° ≥ θ ≥ −71°, −74° ≥ θ ≥ −75° |
| −7° ≤ φ < −6° | −68° ≥ θ ≥ −70°, −73° ≥ θ ≥ −75° |
| −6° ≤ φ < −5° | −72° ≥ θ ≥ −80° |
| −5° ≤ φ < −4° | −73° ≥ θ ≥ −80° |
| −4° ≤ φ < −3° | −74° ≥ θ ≥ −79° |
| −3° ≤ φ < −2° | −73° ≥ θ ≥ −78° |
| −2° ≤ φ < −1° | −14° ≥ θ ≥ −16°, −73° ≥ θ ≥ −77° |
| −1° ≤ φ < 0° | −14° ≥ θ ≥ −16°, −73° ≥ θ ≥ −76°. |

2. The composite substrate according to claim 1, wherein an acoustic velocity of a longitudinal wave propagating through the Si is less than or equal to about 9150 m/sec; and
in the Euler angles (φ, θ, ψ) of the Si, φ is other than about 0° or θ is other than about 0°.

3. The composite substrate according to claim 2, wherein the acoustic velocity of the longitudinal wave propagating through the Si is less than or equal to about 9080 m/sec.

4. An acoustic wave device, comprising:
the composite substrate according to claim 1; and
an IDT electrode in contact with the piezoelectric layer of the composite substrate.

5. The acoustic wave device according to claim 4, wherein the IDT electrode is on a surface of the piezoelectric layer on an opposite side to the support substrate.

6. The acoustic wave device according to claim 4, wherein in the Euler angles (φ, θ, ψ) of the Si, φ is in a range from about −25° to about −15°, and θ is in a range from about −22° to about −14°.

7. The acoustic wave device according to claim 4, wherein an acoustic velocity of the longitudinal wave propagating through the Si is less than or equal to about 9150 m/sec; and in the Euler angles (φ, θ, ψ) of the Si, φ is other than about 0° or θ is other than about 0°.

8. The acoustic wave device according to claim 7, wherein the acoustic velocity of the longitudinal wave propagating through the Si is less than or equal to about 9080 m/sec.

9. A composite substrate, comprising:

a support substrate made of Si;

a piezoelectric layer made of lithium tantalate laminated on the support substrate;

a high acoustic velocity film between the support substrate and the piezoelectric layer, in which an acoustic velocity of a bulk wave propagating through the high acoustic velocity film is higher than an acoustic velocity of an acoustic wave propagating through the piezoelectric layer; and a low acoustic velocity film between the high acoustic velocity film and the piezoelectric layer, in which an acoustic velocity of a bulk wave propagating through the low acoustic velocity film is lower than an acoustic velocity of a bulk wave propagating through the piezoelectric layer; wherein Euler angles of the Si are within any of ranges in Tables 4 to 6 below:

TABLE 4

| φ | θ |
|---|---|
| −90° ≤ φ < −89° | −13° ≥ θ ≥ −16°, −73° ≥ θ ≥ −75° |
| −89° ≤ φ < −88° | −14° ≥ θ ≥ −15°, −72° ≥ θ ≥ −75° |
| −88° ≤ φ < −87° | −71° ≥ θ ≥ −75° |
| −87° ≤ φ < −86° | −70° ≥ θ ≥ −75° |
| −86° ≤ φ < −85° | −69° ≥ θ ≥ −80° |
| −85° ≤ φ < −84° | −69° ≥ θ ≥ −80° |
| −84° ≤ φ < −83° | −69° ≥ θ ≥ −79° |
| −83° ≤ φ < −82° | −19° ≥ θ ≥ −22°, −69° ≥ θ ≥ −74°, −76° ≥ θ ≥ −77° |
| −82° ≤ φ < −81° | −19° ≥ θ ≥ −22°, −68° ≥ θ ≥ −74° |
| −81° ≤ φ < −80° | −18° ≥ θ ≥ −22°, −68° ≥ θ ≥ −73° |
| −80° ≤ φ < −79° | −18° ≥ θ ≥ −22°, −67° ≥ θ ≥ −73° |
| −79° ≤ φ < −78° | −18° ≥ θ ≥ −22°, −67° ≥ θ ≥ −74° |
| −78° ≤ φ < −77° | −18° ≥ θ ≥ −22°, −66° ≥ θ ≥ −75° |
| −77° ≤ φ < −76° | −18° ≥ θ ≥ −22°, −65° ≥ θ ≥ −75°, −87° ≥ θ ≥ −88° |
| −76° ≤ φ < −75° | −18° ≥ θ ≥ −22°, −64° ≥ θ ≥ −75°, −84° ≥ θ ≥ −90° |
| −75° ≤ φ < −74° | −17° ≥ θ ≥ −21°, −63° ≥ θ ≥ −77°, −83° ≥ θ ≥ −90° |
| −74° ≤ φ < −73° | −17° ≥ θ ≥ −21°, −62° ≥ θ ≥ −78°, −81° ≥ θ ≥ −86° |
| −73° ≤ φ < −72° | −16° ≥ θ ≥ −21°, −61° ≥ θ ≥ −79°, −80° ≥ θ ≥ −87° |
| −72° ≤ φ < −71° | −15° ≥ θ ≥ −21°, −54° ≥ θ ≥ −59°, −60° ≥ θ ≥ −87° |
| −71° ≤ φ < −70° | −14° ≥ θ ≥ −30°, −52° ≥ θ ≥ −88° |
| −70° ≤ φ < −69° | −13° ≥ θ ≥ −30°, −39° ≥ θ ≥ −40°, −50° ≥ θ ≥ −88° |
| −69° ≤ φ < −68° | −13° ≥ θ ≥ −29°, −37° ≥ θ ≥ −40°, −50° ≥ θ ≥ −88° |
| −68° ≤ φ < −67° | −13° ≥ θ ≥ −29°, −36° ≥ θ ≥ −40°, −49° ≥ θ ≥ −77°, −79° ≥ θ ≥ −88° |
| −67° ≤ φ < −66° | −13° ≥ θ ≥ −28°, −35° ≥ θ ≥ −40°, −49° ≥ θ ≥ −75°, −81° ≥ θ ≥ −88° |
| −66° ≤ φ < −65° | −13° ≥ θ ≥ −28°, −33° ≥ θ ≥ −40°, −49° ≥ θ ≥ −73°, −83° ≥ θ ≥ −87° |
| −65° ≤ φ < −64° | −13° ≥ θ ≥ −28°, −32° ≥ θ ≥ −40°, −48° ≥ θ ≥ −64°, −65° ≥ θ ≥ −72° |
| −64° ≤ φ < −63° | −17° ≥ θ ≥ −28°, −31° ≥ θ ≥ −40°, −46° ≥ θ ≥ −61°, −66° ≥ θ ≥ −73° |
| −63° ≤ φ < −62° | −17° ≥ θ ≥ −40°, −44° ≥ θ ≥ −49°, −50° ≥ θ ≥ −59°, −66° ≥ θ ≥ −73° |
| −62° ≤ φ < −61° | −18° ≥ θ ≥ −40°, −42° ≥ θ ≥ −49°, −51° ≥ θ ≥ −57°, −67° ≥ θ ≥ −72° |
| −61° ≤ φ < −60° | −18° ≥ θ ≥ −49°, −52° ≥ θ ≥ −56°, −67° ≥ θ ≥ −72° |

TABLE 5

| φ | θ |
|---|---|
| −60° ≤ φ < −59° | −18° ≥ θ ≥ −48°, −52° ≥ θ ≥ −54°, −67° ≥ θ ≥ −73° |
| −59° ≤ φ < −58° | −18° ≥ θ ≥ −48°, −68° ≥ θ ≥ −73° |
| −58° ≤ φ < −57° | −19° ≥ θ ≥ −48°, −67° ≥ θ ≥ −73° |
| −57° ≤ φ < −56° | −19° ≥ θ ≥ −48°, −67° ≥ θ ≥ −73° |

TABLE 5-continued

| φ | θ |
|---|---|
| −56° ≤ φ < −55° | −20° ≥ θ ≥ −48°, −67° ≥ θ ≥ −73° |
| −55° ≤ φ < −54° | −20° ≥ θ ≥ −47°, −67° ≥ θ ≥ −73° |
| −54° ≤ φ < −53° | −20° ≥ θ ≥ −44°, −67° ≥ θ ≥ −73° |
| −53° ≤ φ < −52° | −20° ≥ θ ≥ −43°, −67° ≥ θ ≥ −73° |
| −52° ≤ φ < −51° | −19° ≥ θ ≥ −42°, −67° ≥ θ ≥ −72° |
| −51° ≤ φ < −50° | −19° ≥ θ ≥ −24°, −27° ≥ θ ≥ −41°, −68° ≥ θ ≥ −72° |
| −50° ≤ φ < −49° | −25° ≥ θ ≥ −40°, −68° ≥ θ ≥ −72° |
| −49° ≤ φ < −48° | −24° ≥ θ ≥ −40°, −68° ≥ θ ≥ −72° |
| −48° ≤ φ < −47° | −24° ≥ θ ≥ −40°, −68° ≥ θ ≥ −72° |
| −47° ≤ φ < −46° | −23° ≥ θ ≥ −40°, −68° ≥ θ ≥ −72° |
| −46° ≤ φ < −45° | −23° ≥ θ ≥ −39°, −68° ≥ θ ≥ −72° |
| −45° ≤ φ < −44° | −22° ≥ θ ≥ −39°, −68° ≥ θ ≥ −72° |
| −44° ≤ φ < −43° | −21° ≥ θ ≥ −40°, −68° ≥ θ ≥ −72° |
| −43° ≤ φ < −42° | −19° ≥ θ ≥ −40°, −68° ≥ θ ≥ −72° |
| −42° ≤ φ < −41° | −18° ≥ θ ≥ −40°, −68° ≥ θ ≥ −72° |
| −41° ≤ φ < −40° | −17° ≥ θ ≥ −41°, −67° ≥ θ ≥ −72° |
| −40° ≤ φ < −39° | −17° ≥ θ ≥ −23°, −24° ≥ θ ≥ −41°, −67° ≥ θ ≥ −72° |
| −39° ≤ φ < −38° | −17° ≥ θ ≥ −22°, −23° ≥ θ ≥ −41°, −67° ≥ θ ≥ −72° |
| −38° ≤ φ < −37° | −17° ≥ θ ≥ −21°, −22° ≥ θ ≥ −41°, −67° ≥ θ ≥ −72° |
| −37° ≤ φ < −36° | −19° ≥ θ ≥ −20°, −21° ≥ θ ≥ −45°, −67° ≥ θ ≥ −72° |
| −36° ≤ φ < −35° | −21° ≥ θ ≥ −47°, −68° ≥ θ ≥ −72° |
| −35° ≤ φ < −34° | −20° ≥ θ ≥ −48°, −67° ≥ θ ≥ −72° |
| −34° ≤ φ < −33° | −19° ≥ θ ≥ −48°, −67° ≥ θ ≥ −72° |
| −33° ≤ φ < −32° | −19° ≥ θ ≥ −30°, −34° ≥ θ ≥ −48°, −66° ≥ θ ≥ −72° |
| −32° ≤ φ < −31° | −18° ≥ θ ≥ −29°, −35° ≥ θ ≥ −48°, −65° ≥ θ ≥ −73° |
| −31° ≤ φ < −30° | −18° ≥ θ ≥ −29°, −37° ≥ θ ≥ −48°, −52° ≥ θ ≥ −56°, −64° ≥ θ ≥ −73° |

TABLE 6

| φ | θ |
|---|---|
| −30° ≤ φ < −29° | −17° ≥ θ ≥ −29°, −39° ≥ θ ≥ −48°, −51° ≥ θ ≥ −56°, −63° ≥ θ ≥ −73° |
| −29° ≤ φ < −28° | −16° ≥ θ ≥ −28°, −40° ≥ θ ≥ −47°, −51° ≥ θ ≥ −57°, −61° ≥ θ ≥ −73° |
| −28° ≤ φ < −27° | −15° ≥ θ ≥ −28°, −41° ≥ θ ≥ −46°, −50° ≥ θ ≥ −73° |
| −27° ≤ φ < −26° | −14° ≥ θ ≥ −28°, −50° ≥ θ ≥ −73° |
| −26° ≤ φ < −25° | −13° ≥ θ ≥ −28°, −49° ≥ θ ≥ −73°, −84° ≥ θ ≥ −85° |
| −25° ≤ φ < −24° | −14° ≥ θ ≥ −27°, −49° ≥ θ ≥ −75°, −82° ≥ θ ≥ −85° |
| −24° ≤ φ < −23° | −14° ≥ θ ≥ −27°, −49° ≥ θ ≥ −62°, −63° ≥ θ ≥ −79°, −81° ≥ θ ≥ −86° |
| −23° ≤ φ < −22° | −14° ≥ θ ≥ −26°, −50° ≥ θ ≥ −61°, −63° ≥ θ ≥ −87° |
| −22° ≤ φ < −21° | −14° ≥ θ ≥ −29°, −50° ≥ θ ≥ −60°, −63° ≥ θ ≥ −87° |
| −21° ≤ φ < −20° | −14° ≥ θ ≥ −30°, −51° ≥ θ ≥ −58°, −63° ≥ θ ≥ −88° |
| −20° ≤ φ < −19° | −14° ≥ θ ≥ −25°, −52° ≥ θ ≥ −56°, −64° ≥ θ ≥ −88° |
| −19° ≤ φ < −18° | −14° ≥ θ ≥ −24°, −64° ≥ θ ≥ −79°, −80° ≥ θ ≥ −88° |
| −18° ≤ φ < −17° | −14° ≥ θ ≥ −23°, −64° ≥ θ ≥ −78°, −82° ≥ θ ≥ −89° |
| −17° ≤ φ < −16° | −14° ≥ θ ≥ −22°, −64° ≥ θ ≥ −77°, −85° ≥ θ ≥ −90° |
| −16° ≤ φ < −15° | −14° ≥ θ ≥ −22°, −64° ≥ θ ≥ −76°, −87° ≥ θ ≥ −90° |
| −15° ≤ φ < −14° | −16° ≥ θ ≥ −22°, −64° ≥ θ ≥ −75°, −89° ≥ θ ≥ −90° |
| −14° ≤ φ < −13° | −17° ≥ θ ≥ −22°, −67° ≥ θ ≥ −75° |
| −13° ≤ φ < −12° | −18° ≥ θ ≥ −22°, −68° ≥ θ ≥ −75° |
| −12° ≤ φ < −11° | −18° ≥ θ ≥ −25°, −68° ≥ θ ≥ −75° |
| −11° ≤ φ < −10° | −18° ≥ θ ≥ −25°, −68° ≥ θ ≥ −74° |
| −10° ≤ φ < −9° | −18° ≥ θ ≥ −25°, −67° ≥ θ ≥ −73° |
| −9° ≤ φ < −8° | −17° ≥ θ ≥ −25°, −67° ≥ θ ≥ −72° |
| −8° ≤ φ < −7° | −18° ≥ θ ≥ −20°, −66° ≥ θ ≥ −71°, −74° ≥ θ ≥ −75° |
| −7° ≤ φ < −6° | −68° ≥ θ ≥ −70°, −73° ≥ θ ≥ −75° |
| −6° ≤ φ < −5° | −72° ≥ θ ≥ −80° |
| −5° ≤ φ < −4° | −73° ≥ θ ≥ −80° |
| −4° ≤ φ < −3° | −74° ≥ θ ≥ −79° |
| −3° ≤ φ < −2° | −73° ≥ θ ≥ −78° |
| −2° ≤ φ < −1° | −14° ≥ θ ≥ −16°, −73° ≥ θ ≥ −77° |
| −1° ≤ φ < 0° | −14° ≥ θ ≥ −16°, −73° ≥ θ ≥ −76°. |

10. The composite substrate according to claim 9, wherein an acoustic velocity of a longitudinal wave propagating through the Si is less than or equal to about 9150 m/sec; and in the Euler angles (φ, θ, ψ) of the Si, φ is other than about 0° or θ is other than about 0°.

11. The composite substrate according to claim 10, wherein the acoustic velocity of the longitudinal wave propagating through the Si is less than or equal to about 9080 m/sec.

12. An acoustic wave device, comprising:

the composite substrate according to claim 1; and an IDT electrode in contact with the piezoelectric layer of the composite substrate.

13. The acoustic wave device according to claim 12, wherein the IDT electrode is on a surface of the piezoelectric layer on an opposite side to the support substrate.

14. The acoustic wave device according to claim 12, wherein in the Euler angles $(\varphi, \theta, \psi)$ of the Si, $\varphi$ is in a range from about $-25°$ to about $-15°$, and $\theta$ is in a range from about $-22°$ to about $-14°$.

15. The acoustic wave device according to claim 12, wherein an acoustic velocity of a longitudinal wave propagating through the Si is less than or equal to about 9150 m/sec; and in the Euler angles $(\varphi, \theta, \psi)$ of the Si, $\varphi$ is other than about 0° or $\theta$ is other than about 0°.

16. The acoustic wave device according to claim 15, wherein the acoustic velocity of the longitudinal wave propagating through the Si is less than or equal to about 9080 m/sec.

17. A composite substrate, comprising:

a support substrate made of Si;

a piezoelectric layer made of lithium tantalate laminated on the support substrate;

a high acoustic velocity film between the support substrate and the piezoelectric layer, in which an acoustic velocity of a bulk wave propagating through the high acoustic velocity film is higher than an acoustic velocity of an acoustic wave propagating through the piezoelectric layer; and a low acoustic velocity film between the high acoustic velocity film and the piezoelectric layer, in which an acoustic velocity of a bulk wave propagating through the low acoustic velocity film is lower than an acoustic velocity of a bulk wave propagating through the piezoelectric layer; wherein in Euler angles $(\varphi, \theta, \psi)$ of the Si, $\varphi$ is in a range from about $-25°$ to about $-15°$, and $\theta$ is in a range from about $-22°$ to about $-14°$.

18. A composite substrate, comprising:

a support substrate made of Si; and a piezoelectric layer laminated on the support substrate; wherein in the Euler angles $(\varphi, \theta, \psi)$ of the Si, $\varphi$ is in a range from about $-25°$ to about $-15°$, and $\theta$ is in a range from about $-22°$ to about $-14°$.

\* \* \* \* \*